US007365589B2

(12) United States Patent
Chou

(10) Patent No.: US 7,365,589 B2
(45) Date of Patent: Apr. 29, 2008

(54) BANDGAP REFERENCE CIRCUIT

(75) Inventor: Yi-Chung Chou, Taipei (TW)

(73) Assignee: ITE Tech. Inc., Hsinchu (TW)

( * ) Notice: Subject to any disclaimer, the term of this patent is extended or adjusted under 35 U.S.C. 154(b) by 73 days.

(21) Appl. No.: 11/161,789

(22) Filed: Aug. 17, 2005

(65) Prior Publication Data

US 2006/0284668 A1 Dec. 21, 2006

(51) Int. Cl.
*H03K 17/62* (2006.01)

(52) U.S. Cl. ...................... 327/407; 327/539; 327/540; 327/541; 327/542; 327/543; 323/312; 323/313

(58) Field of Classification Search ................. 327/407
See application file for complete search history.

(56) References Cited

U.S. PATENT DOCUMENTS 6,184,726 B1 * 2/2001 Haeberli et al. .............. 327/96
6,556,055 B2 * 4/2003 Soldavini .................... 327/112
6,967,611 B2 * 11/2005 Atriss et al. ................ 341/172
2002/0057126 A1 * 5/2002 Hsu et al. ................... 327/538
2003/0211870 A1 * 11/2003 Jiguet et al. ................ 455/574
2005/0052802 A1 * 3/2005 Wang .......................... 361/79
2005/0099224 A1 * 5/2005 Itoh ........................... 327/541
2005/0174164 A1 * 8/2005 Fuhrmann et al. .......... 327/536
2006/0284668 A1 * 12/2006 Chou ......................... 327/539

* cited by examiner

*Primary Examiner*—Tuan T. Lam
*Assistant Examiner*—Hiep Nguyen
(74) *Attorney, Agent, or Firm*—Jianq Chyun IP Office

(57) ABSTRACT

A bandgap reference circuit, taking two or more power supplies as the input power supply for outputting a reference voltage, includes a first reference circuit, a second reference circuit, a power selection circuit and a switch circuit. The first and second reference circuits receive two respective power supplies for producing first and second voltages, respectively. As the power selection circuit takes the first power voltage level as the input voltage, the power selection circuit outputs a first control signal; while the power selection circuit takes the second power voltage level as the input voltage, the power selection circuit outputs a second control signal. The switch circuit is coupled to the power selection circuit, the first reference circuit and the second reference circuit. As the switch circuit receives the first control signal, it outputs the first voltage; while the switch circuit receives the second control signal, it outputs the second voltage.

8 Claims, 4 Drawing Sheets

BANDGAP REFERENCE CIRCUIT

CROSS-REFERENCE TO RELATED APPLICATION

This application claims the priority benefit of Taiwan application serial no. 94120139, filed on Jun. 17, 2005. All disclosure of the Taiwan application is incorporated herein by reference.

BACKGROUND OF THE INVENTION

1. Field of Invention

The present invention relates to an analog circuit, and particularly to a bandgap reference circuit.

2. Description of the Related Art

Voltage reference circuits and current reference circuits are widely used in analog circuits. The refence circuits provide a DC level with a negligible correlation to process parameters. For example, a bias current of a differential pair circuit must rely on a reference circuit to be generated. In the differential pair circuit, the generated bias current in reverse affects the voltage gain and noise of the circuit. Similarly, in an analog-to-digital converter (ADC) and a digital-to-analog converter (DAC), the entire input/output ranges must be defined by a reference circuit.

Normally, to obtain a stable reference voltage level unvaried with temperature, a PTC (positive temperature coefficient) voltage must be used to compensate a NTC (negative temperature coefficient) voltage, as shown in FIG. 1A, a schematic principle drawing of a conventional bandgap reference circuit. In FIG. 1A, the voltage between base and emitter VBE of the bipolar transistor Q is a NTC voltage. In the circuit, a voltage proportional to absolute temperature (Kelvin degree) is multiplied by K for compensating the voltage VBE with a NTC (negative temperature coefficient). FIG. 1B is a schematic layout of the conventional bandgap reference circuit in FIG. 1A. The circuit in FIG. 1B includes bipolar transistors Q101 and Q102, resistors R101, R102 and R103, and an operational amplifier A100.

Restricted by semiconductor processes, the conventional bandgap reference circuit in FIG. 1B is not capable of providing a lower-voltage reference level output (for example, a level less than IV). To overcome the problem, another conventional lower-voltage bandgap reference circuit was provided, as shown in FIG. 2. The lower-voltage bandgap reference circuit in FIG. 2 includes bipolar transistors Q201 and Q202, P-FETs (P-type field effect transistor) M201, M202 and M203, resistors R201, R202, R203 and R204, and an operational amplifier A200. The circuit uses the scheme of FIG. 1B to produce a stable voltage VR1, which is coupled to the gates of the P-FETs M201, M202 and M203 for forming a current mirror. In the end, the output current from M203 flows into the resistor R204 for producing a reference voltage level VREF.

Yet, there has not been an integrated bandgap reference circuit to produce both a higher-voltage and a lower-voltage so far. To meet such requirement in some applications, a higher-voltage bandgap reference circuit and a lower-voltage bandgap reference circuit are disposed simultaneously, which leads an oversized circuit size.

SUMMARY OF THE INVENTION

An aspect of the present invention is to provide a downsized, integrated bandgap reference circuit used for outputting various voltage levels in response to power outputs.

An embodiment of the present invention provides a bandgap reference circuit selectively taking either a first power voltage level or a second power voltage level as an input voltage thereof, used for outputting a reference voltage. The circuit includes a first reference circuit, a second reference circuit, a power selection circuit and a switch circuit. The first reference circuit receives the first power voltage level for producing a first voltage. The second reference circuit receives the second power voltage level for producing a second voltage. As the first power voltage level is taken as the input voltage, the power selection circuit outputs a first control signal, while the second power voltage level is taken as the input voltage, the power selection circuit outputs a second control signal. The switch circuit is coupled to the power selection circuit, the first reference circuit and the second reference circuit. As the first control signal is received, the switch circuit outputs the first voltage; while the second control signal is received, the switch circuit outputs the second voltage.

Since the switch circuit is employed for switching the different reference voltage levels in response to the different power supply voltages in the embodiment, thus it is possible to integrate a bandgap reference circuit for outputting a higher-voltage level and a bandgap reference circuit for outputting a lower-voltage level together. In the circuit of the embodiment, some components are shared for size reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1A:
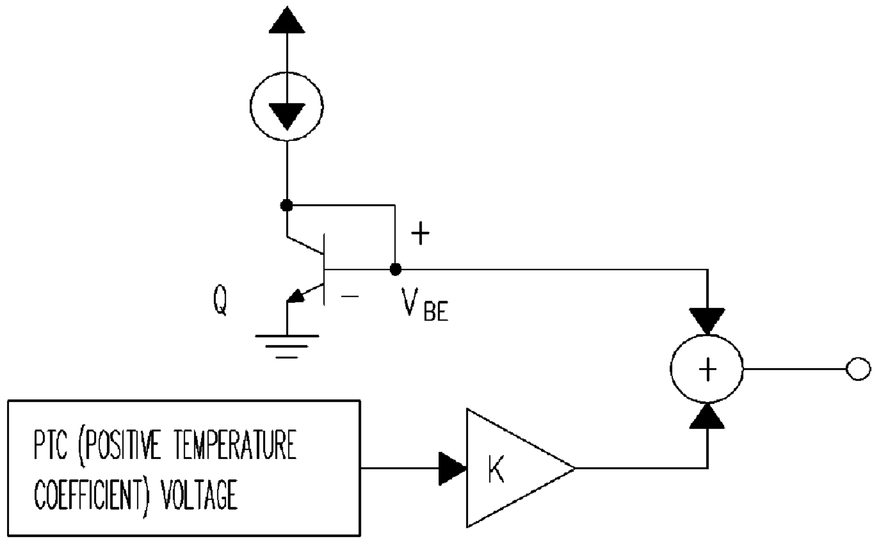
FIG. 1A (PRIOR ART)
FIG. 1A is a schematic principle drawing of a conventional bandgap reference circuit.
Figure 1B:
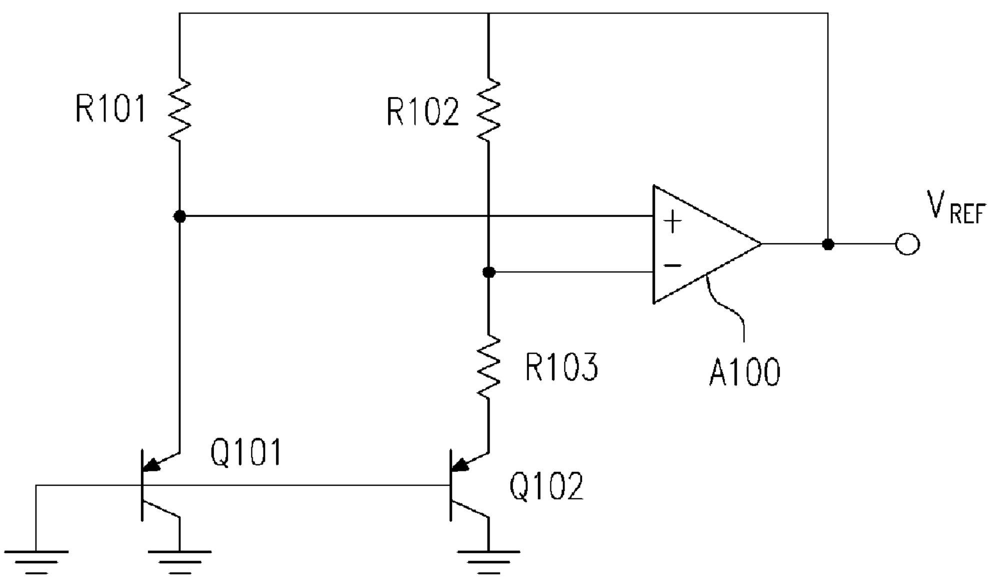
FIG. 1B (PRIOR ART)
FIG. 1B is a schematic layout of the conventional bandgap reference circuit in FIG. 1A.
Figure 2:
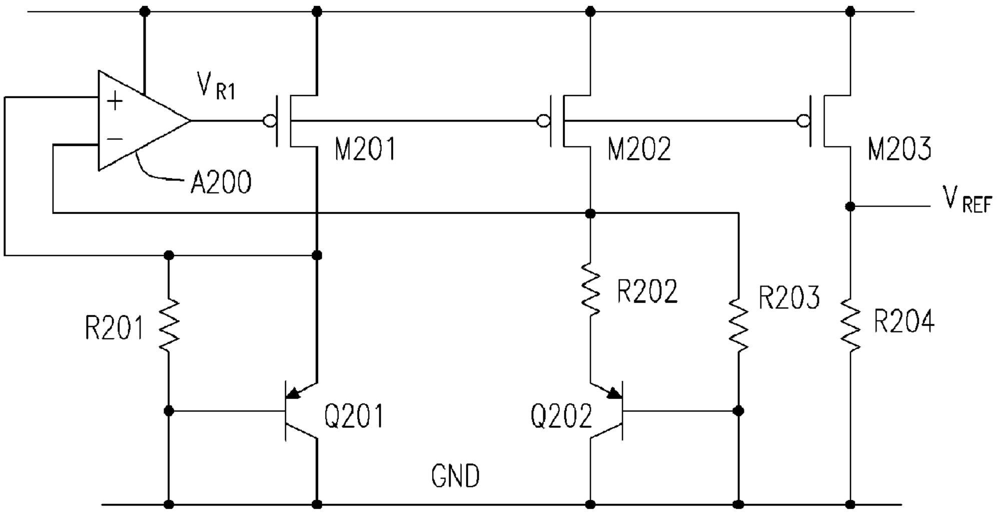
FIG. 2 (PRIOR ART)
FIG. 2 is a schematic layout of a conventional lower-voltage bandgap reference circuit.
Figure 3:
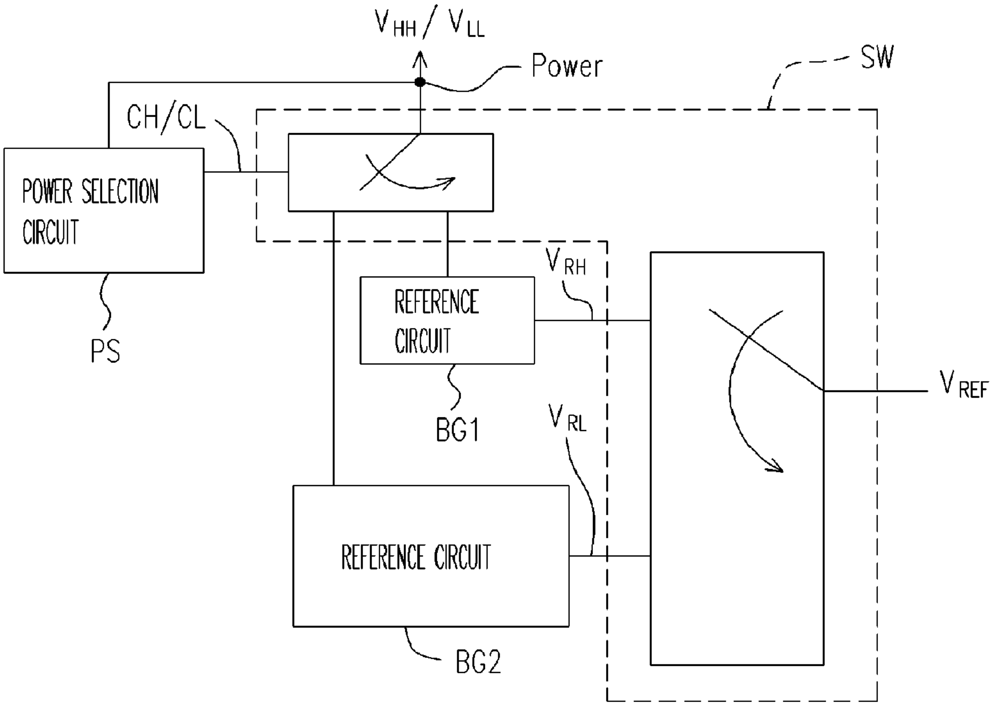
FIG. 3 is a block diagram of a bandgap reference circuit according to the present invention.

The embodiment of the present invention provides a bandgap reference circuit used for outputting different reference voltage levels according to power inputs. The circuit has a multi-power system and integrates a bandgap reference circuit and a lower-voltage bandgap reference circuit together to produce a better, stable reference voltage for outputting. FIG. 3 is a block diagram of a bandgap reference circuit according to the present invention. Referring to FIG. 3, the bandgap reference circuit mainly includes a power terminal Power, a reference voltage terminal VREF, reference circuits BG1 and BG2, a power selection circuit PS and a switch circuit SW. The reference circuit BG1 receives a higher power voltage level VHH for producing a higher reference voltage VRH; while reference circuit BG2 receives a lower power voltage level VLL for producing a higher reference voltage VRL. The power selection circuit PS is coupled to the power terminal. As the power terminal receives a higher power voltage level VHH, PS outputs an effective control signal CH. While the power terminal receives a lower power voltage level VLL, PS outputs an effective control signal CL. The switch circuit SW is coupled to the power selection circuit PS, the reference circuits BG1 and BG2. As the control signal CH is received, SW outputs the reference voltage VRH to the reference voltage terminal VREF; while the control signal CL is received, SW outputs the reference voltage VRL to the reference voltage terminal VREF.

Figure 4:
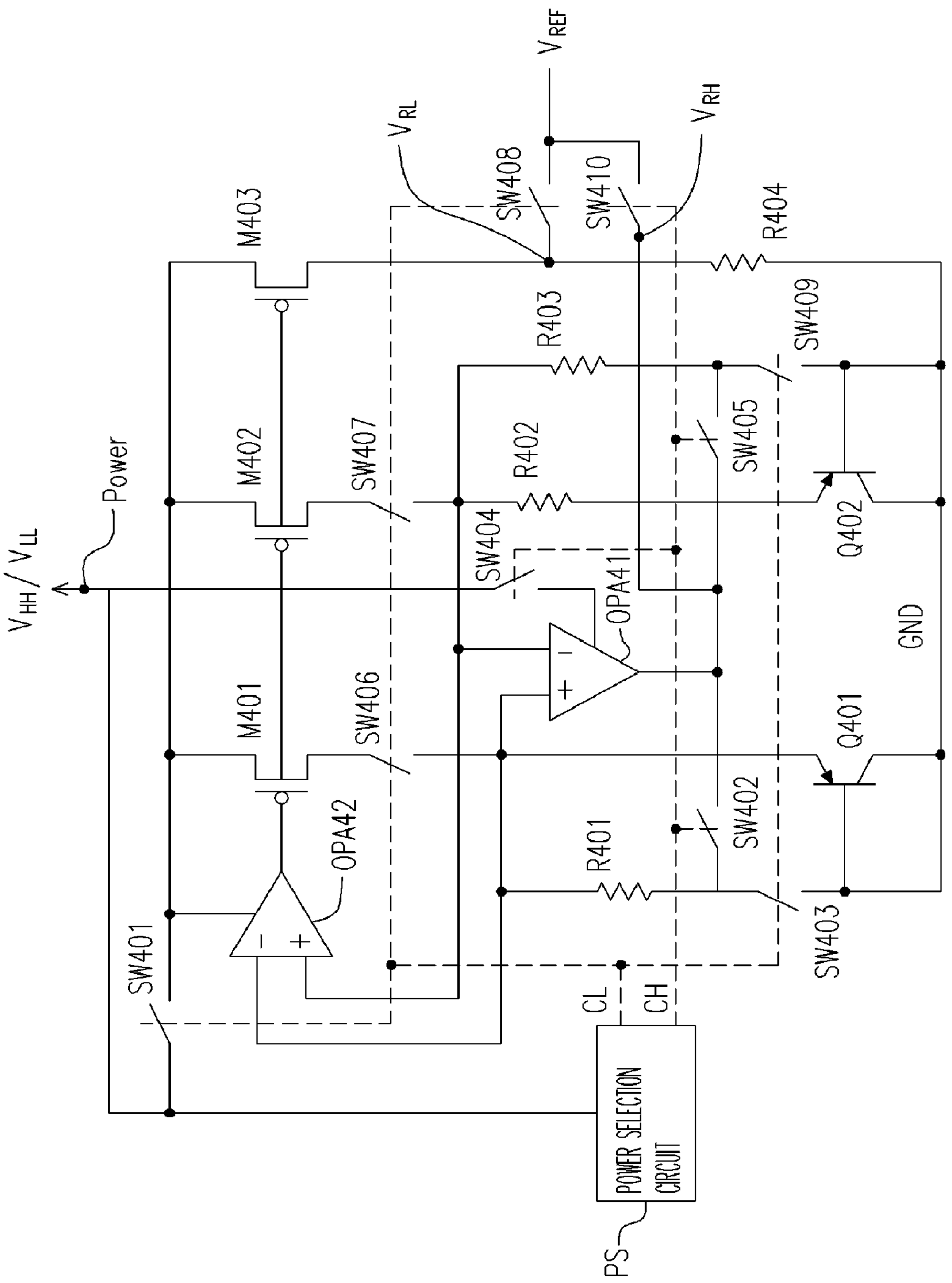
FIG. 4 is an embodiment of the bandgap reference circuit in FIG. 3.

FIG. 4 is an embodiment of the bandgap reference circuit in FIG. 3. FIG. 4 is just an embodiment of the present invention. Many other embodiments can be derived within the scope of the present invention. Referring to FIG. 4, the bandgap reference circuit includes a power terminal Power, a power selection circuit PS, operational amplifiers OPA41 and OPA42, P-FETs (P-type field effect transistor) M401, M402 and M403, resistors R401, R402, R403 and R404, P-type bipolar transistors Q401 and Q402 (providing a PTC (positive temperature coefficient) voltage and a NTC (negative temperature coefficient) voltage), and switches SW401-SW410. Wherein, the operational amplifier OPA41, the resistors R401, R402 and R403 and the P-type bipolar transistors Q401 and Q402 are included in the reference circuit BG1 in FIG. 3; while the operational amplifier OPA42, the P-FETs M401, M402 and M403 and the resistor R404 are included in to the reference circuit BG2 in FIG. 3. In addition, the switches SW401-SW410 are corresponding to the switch circuit SW in FIG. 3.

As the power terminal Power supplies a higher power voltage level VHH (for example, 3V), the power selection circuit PS provides an effective control signal CH to control the switches SW402, SW404, SW405 and SW410 on and the switches SW401, SW403, SW406, SW407, SW408 and SW409 off. Under this state, the operational amplifier OPA42 does not work, instead the operational amplifier OPA41 is in operation. Through the switch SW410, the operational amplifier OPA41 outputs a reference voltage VRH to the reference voltage terminal VREF.

While the power terminal Power supplies a lower power voltage level VLL (for example, 1V), the power selection circuit PS provides an effective control signal CL to control the switches SW401, SW403, SW406, SW407, SW408 and SW409 on and the switches SW402, SW404, SW405, and SW410 off. Under this state, the operational amplifier OPA41 does not work, and the operational amplifier OPA42 is in operation. Elements P-FETs M401, M402 and M403 are considered as a current mirror, and the current from M403 and through the resistor R404 produces a reference voltage VRL at both terminals of R403 for outputting to the reference voltage terminal VREF.

In FIG. 4, a higher-voltage bandgap reference circuit and a lower-voltage bandgap reference circuit are integrated together for producing different, stable reference voltages VRH and VRL in response to different power voltages. In the integrated layout, the bipolar transistors Q401 and Q402, and the resistors R401, R402 and R403 are shared in use, respectively. Therefore, the IC layout area is reduced.

Figure 5:
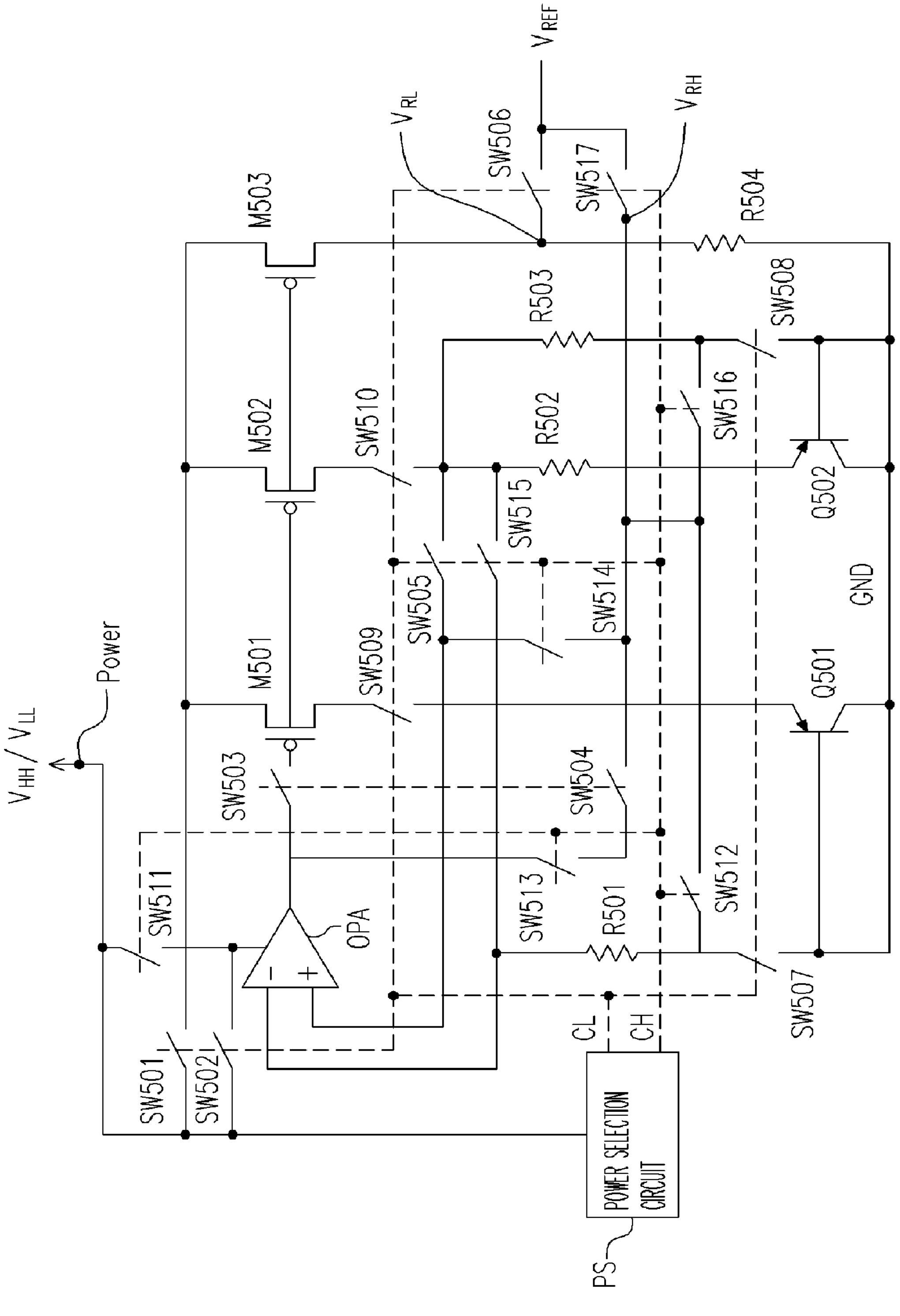
FIG. 5 is another embodiment of the bandgap reference circuit in FIG. 3.

FIG. 5 is another embodiment of the bandgap reference circuit in FIG. 3. Referring to FIG. 5, the bandgap reference circuit in FIG. 5 includes a power terminal Power, a power selection circuit PS, an amplifier OPA, P-FETs (P-type field effect transistor) M501, M502 and M503, resistors R501, R502, R503 and R504, P-type bipolar transistors Q501 and Q502 (providing a PTC (positive temperature coefficient) voltage and a NTC (negative temperature coefficient) voltage), and switches SW501-SW517. Wherein, the amplifier OPA, the resistors R501, R502 and R503 and the P-type bipolar transistors Q501 and Q502 are included in the reference circuit BG1 in FIG. 3; while the P-FETs M501, M502 and M503 and the resistor R504 are included in the reference circuit BG2 in FIG. 3. In addition, the switches SW501-SW517 are corresponding to the switch circuit SW in FIG. 3.

As the power terminal Power supplies a higher power voltage level VHH (for example, 3V), the power selection circuit PS provides an effective control signal CH for controlling the switches SW511, SW512, SW513, SW514, SW515, SW516 and SW517 on and the switches SW501, SW502, SW503, SW504, SW505, SW506, SW507, SW508, SW509 and SW510 off. Once receiving the higher power voltage level VHH, the operational amplifier OPA is in operation. Through the switch SW513 and SW517, the operational amplifier OPA outputs a reference voltage VRH to the reference voltage terminal VREF.

While the power terminal Power supplies a lower power voltage level VLL (for example, 1V), the power selection circuit PS provides an effective control signal CL for the switches SW501, SW502, SW503, SW504, SW505, SW506, SW507, SW508, SW509 and SW510 to be turned on, along with controlling the switches SW511, SW512, SW513, SW514, SW515, SW516 and SW517 to be off. Once the operational amplifier OPA receives the power voltage level VLL, the operational amplifier OPA outputs a voltage via the switch SW503 to control the P-FETs M501, M502 and M503 as a current mirror. The current from M403 flowing through the resistor R504 produces a reference voltage VRL at both terminals of R504 and VRL then is output to the reference voltage terminal VREF.

Referring to FIG. 5 again, in the embodiment, a higher-voltage bandgap reference circuit and a lower-voltage bandgap reference circuit are further integrated together for producing different, stable reference voltages. In the integrated layout, not only the bipolar transistors Q501 and Q502 and the resistors R501, R502 and R503, but also the operational amplifier OPA, are shared in use, respectively. Therefore, the IC layout area is further reduced.

As discussed above, it can be seen that since the switch circuit is employed for switching the different reference voltage levels in response to the different power supply voltages in the embodiment, thus it is possible to integrate a bandgap reference circuit for outputting a higher-voltage level and a bandgap reference circuit for outputting a lower-voltage level. In the circuit of the embodiment, some components are shared for use, which results in a reduced IC (integrated circuit) size.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A bandgap reference circuit, selectively taking either a first power voltage level or a second power voltage level as an input voltage thereof for outputting a reference voltage, comprising:

a first reference circuit, receiving the first power voltage level for producing a first voltage;

a second reference circuit, receiving the second power voltage level for producing a second voltage;

a power selection circuit, used for outputting a first control signal in response to taking in the first power voltage level as the input voltage of the bandgap reference circuit and for outputting a second control signal in response to taking the second power voltage level as the input voltage of the bandgap reference circuit; and a switch circuit, coupled to the power selection circuit, the first reference circuit and the second reference circuit, for outputting the first power voltage level in response to the first control signal and for outputting the second power voltage level in response to the second control signal.

2. The bandgap reference circuit as recited in claim 1, wherein the first reference circuit comprises:

a first operational amplifier, comprising a first power input terminal, a first positive input terminal, a first negative input terminal and a first output terminal, used for producing the first voltage;

a first bipolar transistor, comprising a first base terminal, a first emitter terminal and a first collector terminal, wherein the first base terminal and the first collector terminal are grounded and the first emitter teminal is coupled to the first positive input terminal;

a second bipolar transistor, comprising a second base terminal, a second emitter terminal and a second collector terminal, wherein the second base terminal and the second collector terminal are grounded;

a first resistor, wherein one terminal thereof is coupled to the first positive input terminal, and another terminal thereof is selectively coupled to the first output terminal and selectively grounded;

a second resistor, wherein one terminal thereof is coupled to the first negative input terminal, and another terminal thereof is coupled to the second emitter; and a third resistor, wherein one terminal thereof is coupled to the first negative input terminal, and another terminal thereof is coupled to the first output terminal and selectively grounded.

3. The bandgap reference circuit as recited in claim 2, wherein the second reference circuit comprises:

a power input terminal for receiving the input voltage;

a second operational amplifier, comprising a second power input terminal, a second positive input terminal, a second negative input terminal and a second output terminal, wherein the second positive input terminal is coupled to the first negative input terminal, and the second negative input terminal is coupled to the first positive input terminal;

a first FET (field effect transistor), comprising a gate terminal, a first source/drain terminal and a second source/drain terminal, wherein the gate terminal thereof is coupled to the second output terminal, the first source/drain terminal, is selectively coupled to the power input terminal, and the second source/drain terminal is selectively coupled to the second negative input terminal;

a second PET (field effect transistor), comprising a gate terminal, a first source/drain terminal and a second source/drain terminal, wherein the gate terminal thereof is coupled to the second output terminal, the first source/drain terminal is selectively coupled to the power input terminal, and the second source/drain terminal is selectively coupled to the second positive input terminal;

a fourth resistor, wherein one terminal thereof is grounded; and a third FET (field effect transistor), comprising a gate terminal, a first source/drain terminal arid a second source/drain terminal, wherein the gate terminal thereof is coupled to the second output terminal, the first source/drain terminal is selectively coupled to the power input terminal, and the second source/drain terminal is coupled to another terminal of the fourth resistor for producing the second voltage.

4. The bandgap reference circuit as recited in claim 3, wherein the switch circuit comprises:

a reference voltage terminal;

a first switch, comprising a first terminal, a second terminal and a control terminal, wherein the first terminal thereof is coupled to the power input terminal; the second terminal thereof is coupled to the first source/drain terminals of the first FET, the second FET and the third FET and to the second power input terminal; as the control terminal thereof receives the second control signal, the first switch is turned on between the first terminal and the second terminal;

a second switch, comprising a first terminal, a second terminal and a control terminal, wherein the first terminal thereof is coupled to the first output terminal; the second terminal thereof is coupled to another terminal of the first resistor; as the control terminal thereof receives the first control signal, the second switch is turned on between the first terminal and the second terminal;

a third switch, comprising a first terminal, a second terminal and a control terminal, wherein the first terminal thereof is coupled to another terminal of the first resistor; the second terminal thereof is coupled to the base of the first bipolar transistor;

as the control terminal thereof receives the second control signal, the third switch is turned on between the first terminal and the second terminal;

a fourth switch, comprising a first terminal, a second terminal and a control terminal, wherein the first terminal thereof is coupled to the power input terminal; the second terminal thereof is coupled to the first power input terminal; as the control terminal thereof receives the first control signal, the fourth switch is turned on between the first terminal and the second terminal;

a fifth switch, comprising a first terminal, a second terminal and a control terminal, wherein the first terminal thereof is coupled to the first output terminal; the second terminal thereof is coupled to another terminal of the third resistor; as the control terminal thereof receives the first control signal, the fifth switch is turned on between the first terminal and the second terminal;

a sixth switch, comprising a first terminal, a second terminal and a control terminal, wherein the first terminal thereof is coupled to the second source/drain terminal of the first FET; the second terminal thereof is coupled to the first positive input terminal; as the control terminal thereof receives the second control signal, the sixth switch is turned on between the first terminal and the second terminal;

a seventh switch, comprising a fast terminal, a second terminal and a control terminal, wherein the first terminal thereof is coupled to the second source/drain terminal of the second FET; the second terminal thereof is coupled to the first negative input terminal; as the control terminal thereof receives the second control signal, the seventh switch is turned on between the first terminal and the second terminal;

an eighth switch, comprising a first terminal, a second terminal and a control terminal, wherein the first terminal thereof is coupled to the second source/drain terminal of the third FET; the second terminal thereof is coupled to the reference voltage terminal; as the control terminal thereof receives the second control signal, the eighth switch is turned on between the first terminal and the second terminal;

a ninth switch, comprising a first terminal, a second terminal and a control terminal, wherein the first terminal thereof is coupled to another terminal of the third resistor; the second terminal thereof is grounded; as the control terminal thereof receives the second control signal, the ninth switch is turned on between the first terminal and the second terminal; and a tenth switch, comprising a first terminal, a second terminal and a control terminal, wherein the first terminal thereof is coupled to the first output terminal; the second terminal thereof is coupled to the reference voltage terminal; as the control terminal thereof receives the first control signal, the tenth switch is turned on between the first terminal and the second terminal.

5. The bandgap reference circuit as recited in claim 1, wherein the first reference circuit comprises:

a power input terminal for receiving the input voltage;

an operational amplifier, comprising a power terminal, a positive input terminal, a negative input terminal and an operational output terminal, wherein the power terminal is selectively coupled to the power input terminal used for producing the first voltage at the operational output terminal;

a first bipolar transistor, comprising a first base terminal, a first emitter terminal and a first collector terminal, wherein the first base terminal and the first collector terminal are grounded, and the first emitter terminal is selectively coupled to the negative input terminal and selectively coupled to the positive input terminal;

a second bipolar transistor, comprising a second base terminal, a second emitter terminal and a second collector terminal, wherein the second base terminal and the second collector terminal are grounded;

a first resistor, wherein one terminal thereof is coupled to the negative input terminal, and another terminal thereof is selectively grounded and selectively coupled to the operational output terminal;

a second resistor, wherein one terminal thereof is coupled to the second emitter terminal, and another terminal thereof is selectively coupled to the negative input terminal and selectively coupled to the positive input terminal; and a third resistor, wherein one terminal thereof is coupled to another terminal of the second resistor, and another terminal thereof is selectively coupled to the ground and selectively coupled to the operational output terminal.

6. The bandgap reference circuit as recited in claim 5, wherein the second reference circuit comprises:

a first FET (field effect transistor), comprising a gate terminal, a first source/drain terminal and a second source/drain terminal, wherein the gate terminal thereof is selectively coupled to the operational output terminal, the first source/drain terminal thereof is selectively coupled to the power input terminal;

a second FET (field effect transistor), comprising a gate terminal, a first source/drain terminal and a second source/drain terminal, wherein the gate terminal thereof is coupled to the gate terminal of the first FET, the first source/drain terminal thereof is coupled to the first source/drain terminal of the first FET, and the second source/drain terminal thereof is selectively coupled to another terminal of the second resistor;

a fourth resistor, wherein one terminal thereof is grounded; and a third FET (field effect transistor), comprising a gate terminal, a first source/drain terminal and a second source/drain terminal, wherein the gate terminal thereof is coupled to the gate terminal of the second FET, the first source/drain terminal thereof is coupled to the first source/drain terminal of the second FET, and the second source/drain terminal thereof is coupled to another terminal of the fourth resistor for outputting the second voltage.

7. The bandgap reference circuit as recited in claim 6, wherein the switch circuit comprises:

a reference voltage terminal;

a first switch, comprising a first terminal, a second terminal and a control terminal, wherein the first terminal thereof is coupled to the power input terminal; the second terminal thereof is coupled to the first source/drain terminals of the first FET, the second FET and the third FET; as the control terminal thereof receives the second control signal, the first switch is turned on between the first terminal and the second terminal;

a second switch, comprising a first terminal, a second terminal and a control terminal, wherein the first terminal thereof is coupled to the power input terminal, the second terminal thereof is coupled to the power terminal of the operational amplifier; as the control terminal thereof receives the second control signal, the second switch is turned on between the first terminal and the second terminal;

a third switch, comprising a first terminal, a second terminal and a control terminal, wherein the first terminal thereof is coupled to the operational output terminal;

the second terminal thereof is coupled to the gate terminal of the first FET; as the control terminal thereof receives the second control signal, the third switch is turned on between the first terminal and the second terminal;

a fourth switch, comprising a first terminal, a second terminal and a control terminal, wherein the first terminal thereof is coupled to the positive input terminal; the second terminal thereof is coupled to the emitter terminal of the first bipolar transistor; as the control terminal thereof receives the second control signal, the fourth switch is turned on between the first terminal and the second terminal;

a fifth switch, comprising a first terminal, a second terminal and a control terminal, wherein the first terminal thereof is coupled to the positive input terminal; the second terminal thereof is coupled to another terminal of the second resistor; as the control terminal thereof receives the second control signal, the fifth switch is turned on between the first terminal and the second terminal;

a sixth switch, comprising a first terminal, a second terminal and a control terminal, wherein the first terminal thereof is coupled to the second source/drain terminal of the third FET; the second terminal thereof is coupled to the reference voltage terminal; as the control terminal thereof receives the second control signal, the sixth switch is turned on between the first terminal and the second terminal;

a seventh switch, comprising a first terminal, a second terminal and a control terminal, wherein the first terminal thereof is coupled to another terminal of the first resistor; the second terminal thereof is grounded; as the control terminal thereof receives the second control signal, the seventh switch is turned on between the first terminal and the second terminal;

an eighth switch, comprising a first terminal, a second terminal and a control terminal, wherein the first terminal thereof is coupled to another terminal of the third resistor; the second terminal thereof is grounded; as the control terminal thereof receives the second control signal, the eighth switch is turned on between the first terminal and the second terminal;

a ninth switch, comprising a first terminal, a second terminal and a control terminal, wherein the first terminal thereof is coupled to the second source/drain terminal of the first FET; the second terminal thereof is coupled to the emitter terminal of the first bipolar transistor; as the control terminal thereof receives the second control signal, the ninth switch is turned on between the first terminal and the second terminal;

a tenth switch, comprising a first terminal, a second terminal and a control terminal, wherein the first terminal thereof is coupled to the second source/drain terminal of the second FET; the second terminal thereof is coupled to another terminal of the second resistor; as the control terminal thereof receives the first control signal, the tenth switch is turned on between the first terminal and the second terminal;

an eleventh switch, comprising a first terminal, a second terminal and a control terminal, wherein the first terminal thereof is coupled to the power input terminal; the second terminal thereof is coupled to the power terminal of the operational amplifier; as the control terminal thereof receives the first control signal, the eleventh switch is turned on between the first terminal and the second terminal;

a twelfth switch, comprising a first terminal, a second terminal and a control terminal, wherein the first terminal thereof is coupled to another terminal of the first resistor; the second terminal thereof is coupled to the operational output terminal; as the control terminal thereof receives the first control signal, the twelfth switch is turned on between the first terminal and the second terminal;

a thirteenth switch, comprising a first terminal, a second terminal and a control terminal, wherein the first terminal thereof is coupled to the positive input terminal; the second terminal thereof is coupled to the emitter terminal of the first bipolar transistor; as the control terminal thereof receives the first control signal, the thirteenth switch is turned on between the first terminal and the second terminal;

a fourteenth switch, comprising a first terminal, a second terminal and a control terminal, wherein the first terminal thereof is coupled to the negative input terminal; the second terminal thereof is coupled to another terminal of the second resistor; as the control terminal thereof receives the first control signal, the fourteenth switch is turned on between the first terminal and the second terminal;

a fifteenth switch, comprising a first terminal, a second terminal and a control terminal, wherein the first terminal thereof is coupled to the second terminal of the twelfth switch; the second terminal thereof is coupled to another terminal of the third resistor; as the control terminal thereof receives the first control signal, the fifteenth switch is turned on between the first terminal and the second terminal;

a sixteenth switch, comprising a first terminal, a second terminal and a control terminal, wherein the first terminal thereof is coupled to the second terminal of the twelfth switch; the second terminal thereof is coupled to the reference voltage terminal; as the control terminal thereof receives the first control signal, the sixteenth switch is turned on between the first terminal and the second terminal.

8. The bandgap reference circuit as recited in claim 7, wherein the switch circuit further comprises:

a seventeenth switch, comprising a first terminal, a second terminal and a control terminal, wherein the first terminal thereof is coupled to the operational output terminal; the second terminal thereof is coupled to the second terminal of the twelfth switch; as the control terminal thereof receives the first control signal, the seventeenth switch is turned on between the first terminal and the second terminal.

* * * * *